United States Patent [19]

Imaizumi et al.

[11] 4,023,973
[45] May 17, 1977

[54] PHOTOSENSITIVE COMPOSITION USING MALEIC ANHYDRIDE ADDUCT OF A 1,2 POLYBUTADIENE

[75] Inventors: Fumitake Imaizumi, Yamato; Isao Nagaoka, Yokkaichi; Mitsuo Kurokawa, Yokohama; Koei Komatsu, Yokkaichi; Yasuyuki Takimoto, Takatsuki; Hidefumi Kusuda, Hirakata, all of Japan

[73] Assignee: Japan Synthetic Rubber Co., Ltd., Tokyo, Japan

[22] Filed: Apr. 17, 1975

[21] Appl. No.: 569,145

[30] Foreign Application Priority Data

Apr. 8, 1974  Japan .............................. 49-44116
Mar. 11, 1975  Japan .............................. 50-28688

[52] U.S. Cl. .............................. 96/115 R; 96/35.1; 96/36; 96/36.2; 96/36.3; 96/91 N; 96/115 P; 204/159.15; 204/159.16; 204/159.18; 204/159.2; 204/159.22; 204/159.23

[51] Int. Cl.² .............................. G03C 1/70; G03C 1/68

[58] Field of Search ............. 96/91 N, 115 R, 35.1, 96/115 P; 204/159.15, 159.16, 159.2, 159.22, 159.23, 159.18

[56] References Cited
UNITED STATES PATENTS

| | | | |
|---|---|---|---|
| 2,848,328 | 8/1958 | Hepher .............................. | 96/91 N |
| 2,852,379 | 9/1958 | Hepher et al. ...................... | 96/91 N |
| 2,980,534 | 4/1961 | Printy et al. ....................... | 96/93 |
| 3,002,003 | 9/1961 | Merrill et al. ...................... | 96/91 N |
| 3,278,305 | 10/1966 | Laridon et al. ..................... | 96/91 N |
| 3,357,831 | 12/1967 | Wu ..................................... | 96/91 N |
| 3,467,523 | 9/1969 | Seidel et al. ...................... | 96/115 R |
| 3,549,373 | 12/1970 | Hamada et al. ....................... | 96/75 |
| 3,595,656 | 7/1971 | Ruckert et al. ...................... | 96/91 N |
| 3,840,449 | 10/1974 | Furukawa et al. ............... | 204/159.23 |
| 3,852,225 | 12/1974 | Ishikawa et al. ....................... | 260/5 |
| 3,888,670 | 6/1975 | Stolka ............................... | 96/115 R |
| 3,905,820 | 9/1975 | Frass ................................. | 96/115 R |
| 3,933,746 | 1/1976 | Steele ............................... | 96/115 R |
| 3,948,667 | 4/1976 | Ichikawa et al. ................... | 96/115 R |

OTHER PUBLICATIONS

Fieser & Fieser, "Organic Chemistry", 3rd Ed., Reinhold Pub. Corp., 1956, pp. 310-312.
"Encyclopedia of Polymer Science & Technology", vol. 2, Interscience Pub., 1965, pp. 678-684.

*Primary Examiner*—Charles L. Bowers, Jr.
*Attorney, Agent, or Firm*—Oblon, Fisher, Spivak, McClelland & Maier

[57] ABSTRACT

A photosensitive composition comprising (1) a maleic anhydride adduct of 1,2-polybutadiene having a molecular weight of 10,000 or higher, (2) at least one photosensitizer and/or at least one photosensitive crosslinking agent, and, if necessary, (3) at least one acrylic monomer. This composition can be developed with water or a polar solvent such as an alcohol, and its layer formed on a support provides a printing plate. When the acrylic monomer is contained, the composition is suitable for use in flexographic printing.

22 Claims, No Drawings

PHOTOSENSITIVE COMPOSITION USING MALEIC ANHYDRIDE ADDUCT OF A 1,2 POLYBUTADIENE

This invention relates to a photosensitive composition and, more particularly, to a photosensitive composition which is developable with water or an alcohol and which contains a maleic anhydride adduct of 1,2-polybutadiene, a photosensitizer and/or a photosensitive crosslinking agent, and, if necessary, an acrylic monomer.

It has been disclosed in Japanese Patent Publication No. 19,162/74 and Japanese Patent Application Kokai (Laid-open) No. 11,047/73 that a composition comprising 1,2-polybutadiene and an organic-solvent-soluble photosensitive crosslinking agent or photosensitizer has excellent performance characteristics as a solvent-developable photosensitive composition. 1,2-Polybutadiene as such, however, cannot be utilized as a water- or alcohol-developable photosensitive composition, because, it is insoluble in polar solvents such as water and alcohols, though soluble in many organic solvents.

Recently, the use of solvent-developable photosensitive resins has very substantially increased in such fields as printing, metal treatment, and printed circuits. On the other hand, however, the environmental pollution caused by organic solvents has become an important social problem. In view of more severe environmental pollution standards, the need for improved working environments, and the need for reducing manufacturing costs, the need for water-developable photosensitive resins is urgent. Although some of such resins are commercially available, they are unsatisfactory. For example, low molecular weight resins are usually utilized as the starting materials of the water-developed type photosensitive resins in order to easily dissolve in water. But the mechanical properties of the relief obtained by crosslinking such low molecular weight resins are insufficient. When a printing plate with such a relief of insufficient strength is used in printing, the wear resistance is decreased, and during the period of printing, fine lines or dots are lost.

The present inventors have found that a photosensitive composition having an improved mechanical strength and developable with water, an alcohol, or a mixture of water, an alcohol, and an ether is obtained by combining a maleic anhydride adduct of high-molecular-weight 1,2-polybutadiene with a photosensitizer and/or a photosensitive crosslinking agent. Further, the present inventors have succeeded in markedly reducing the time of exposure and that of development without sacrificing the rubbery properties inherent in 1,2-polybutadiene by the combined use of the said adduct, a photopolymerizable acrylic monomer, and a photosensitizer and/or photosensitive crosslinking agent.

According to this invention, there is provided a photosensitive composition comprising (1) a maleic anhydride adduct of 1,2-polybutadiene having a viscosity-average molecular weight of 10,000 or higher, (2) at least one photosensitizer and/or at least one photosensitive crosslinking agent, and, if necessary, (3) at least one acrylic monomer; and further provided a printing plate composed of a layer of said photosensitive material and a support.

It has been over ten years since a photosensitive resin was used for the first time as a printing plate material. The photosensitive resin was developed initially for the purpose of commercializing it as a substitute for a metal plate to be etched, and lately the initial purpose has been almost completely achieved in the form of a letterpress printing plate; now, the endeavor is directed to develop a photosensitive resin for use in flexographic printing.

The flexographic process is suitable for printing a plastic film made of polyethylene, polypropylene, or the like, kraft paper, corrugated paper, etc. and the printing plate material is required to be flexible and to have a high wear resistance.

A conventional method for making the flexographic printing plate comprises casting a thermosetting resin on an etched metal plate under heat and pressure to form a matrix and then molding a natural or synthetic rubber or polyvinyl chloride under heat and pressure, and another method comprises hand-engraving an image directly on a rubber sheet. The former method is disadvantageous in complicated and time-consuming operation. The latter hand-engraving method requires skilled experts.

Currently, on the other hand, attempts are being made to utilize known photosensitive resins in flexographic printing. One of the known examples is the NP-Flexo system of BASF Co. in West Germany. This system, however, is not yet in actual use because of the following disadvantages: (1) a long time (30 to 45 minutes) is required for printing plate making, (2) an organic solvent (a ketone) must be used in developing, (3) special developing equipment is required to cope with problems of flammability and vapor disposal or recovery associated with the use of an organic solvent, and (4) the plate material is expensive.

By use of the present photosensitive composition in a flexographic printing plate, the above-noted disadvantages can be eliminated while retaining the desirable properties of conventional photosensitive resins, and the following advantages are offered: (1) the time required for plate making is short (15 to 20 minutes), (2) the printing plate is developable with water alone, (3) since the plate is developable with water, no special equipment is necessary because there is no problem of flammability and vapor disposal or vapor recovery (a spraying type development equipment is sufficient), and (4) the plate material is inexpensive.

Heretofore water-developable photosensitive compositions comprising a polymer, an acrylic monomer, and a photosensitizer have been known. Since these compositions contain as the main component such a high-molecular-weight polymer as polyvinyl alcohol, cellulose, polyethylene oxide, or the like, they are insufficient in flexibility and rubber elasticity and, hence, unsuitable for use in the flexographic printing process. On the contrary, owing to the rubbery nature of 1,2-polybutadiene, a water-developable photosensitive sheet composed of the present photosensitive composition and a flexible clear supporting sheet possesses excellent flexibility as well as excellent rubber elasticity, both of which are prerequisite properties for a flexographic printing plate.

The 1,2-polybutadiene suitable for use in this invention has preferably a vinyl content of 70% or more, more preferably 85% or more, as measured by the Morero method based on infrared absorption analysis described in U.S. Pat. No. 3,852,225. If the vinyl content is below 70%, the sensitivity to exposure of the resulting photosensitive composition decreases and, moreover, the amount of maleic anhydride added to the polymer cannot sufficiently be increased.

The 1,2-polybutadiene used in this invention has a viscosity-average molecular weight of 10,000 or higher, preferably 10,000 to 150,000, more preferably 10,000 to 100,000. If the viscosity-average molecular weight is below 10,000, the resulting photosensitive composition becomes too low in elasticity and flexural strength to be satisfactorily used in a flexographic printing plate, while too high a viscosity-average molecular weight (exceeding 150,000) causes a difficulty in dissolving the polymer in water or an alcohol. An insolubilized photoresist obtained by crosslinking such a high-molecular-weight polymer is excellent in both chemical resistance and mechanical strength, and can be used as a resist in making an integrated circuit which resist is exposed to hydrofluoric acid etching conditions. Such a polymer is also superior to other photosensitive resins in mechanical strength and exhibits an extremely high wear resistance when used as printing plate material.

The crystallinity of the present 1,2-polybutadiene as measured by the density measurement method disclosed in U.S. Pat. No. 3,852,225, although not critical, is preferably 45% or less, more preferably 5 to 40%. If the crystallinity exceeds 45%, addition of maleic anhydride becomes more difficult because the solubility of 1,2-polybutadiene is decreased, and, in addition, the ability of the photosensitive composition to dissolve in water is decreased. In view of the dimensional stability, which is one of the necessary properties of a photosensitive composition it is preferable that the 1,2-polybutadiene has a crystallinity of about 5% or more.

The addition of maleic anhydride to 1,2-polybutadiene can be effected, for example, by heating 1,2-polybutadiene and maleic anhydride at about 220° C. with stirring in a halogenated aromatic hydrocarbon solvent, such as α-chloronaphthalene, whereby maleic anhydride can be added in any proportion such as up to about 30% by weight. The amount of bonded maleic anhydride is preferably from about 10% to about 30% by weight. If it is less than 10% by weight, the dissolving property becomes insufficient, while if it exceeds 30% by weight, the addition product tends to be less elastic and becomes harder, brittle, and susceptible to flexural cracking.

In the present invention, the maleic anhydride adduct of 1,2-polybutadiene can be used as follows: (1) The adduct is used, as such and the resulting photosensitive composition is developed with a developing solution containing a caustic alkali such as NaOH, KOH, or LiOH; (2) The adduct is hydrolyzed to open the acid anhydride ring and then used in the thus opened ring form in a photosensitive composition, which is developed with an aqueous developing solution containing or not containing a caustic alkali, ammonia, or the like; or (3) the adduct is partially or completely neutralized with an alkali or ammonia, and the thus neutralized product (salt) is used. The term "maleic anhydride adduct of 1,2-polybutadiene" is used herein to include all of the above-listed forms. Of these forms, the partially or completely neutralized product with an alkali metal is preferred in view of the developing treatment; a lithium salt (partially or completely neutralized product) is particularly suitable because of the ease of development.

When the acrylic monomer is used, the presence of the photopolymerizable liquid acrylic monomer in the layer of photosensitive composition accelerates the rate of photocrosslinking, reduces the period of exposure, and, in addition, facilitates the dissolution of unexposed area (that is, development). Accordingly, the present photosensitive composition is suitable in uses where a flexible relief image is formed, particularly suitable as a photosensitive composition for the flexographic printing of packagings.

As the acrylic monomer used in this invention, there can be exemplified, for instance, esters of acrylic or methacrylic acid, in which the alcohol moiety is an alkyl group having 1 to 31, preferably 1 to 18, carbon atoms such as methyl, ethyl, n-butyl, tert-butyl, 2-ethylhexyl, lauryl, octyl, stearyl, or the like; a hydroxyalkyl group having 2 to 3 carbon atoms such as 2-hydroxyethyl, 2-hydroxypropyl alcohol; an alkyleneglycol or polyalkylene glycol residue (diesters in these cases) having 2 to 60, preferably 2 to 46, carbon atoms such as ethylene glycol, diethylene glycol, triethylene glycol, polyethylene glycol, 1,3-butylene glycol, propylene glycol, polypropylene glycol or the like; an alkoxyalkylene glycol or alkoxypolyalkylene glycol residue (monoesters in these cases) having 3 to 61, preferably 3 to 47 carbon atoms such as methoxyethylene glycol, methoxypolyethylene glycol or the like; or a polyhydric alcohol residue (diesters, triesters, and tetraesters are included in these cases) such as glycerol, trimethylolalkane, tetramethylolalkane or the like (the alkane includes methane, ethane, and propane). Also included in the acrylic monomers are amides such as acrylamide, methacrylamide, N-tert-butylacrylamide, diacetoneacrylamide, N,N'-methylenebisacrylamide, N,N'-benzylidenebisacrylamide, N,N'-xylylenebisacrylamide, N,N'-hexamethylenebisacrylamide, N,N'-tetramethylenebisacrylamide, N,N'-1,2-dihydroxyethylenebisacrylamide, N,N'-1,2-dimethyoxyethylenebisacrylamide and the like; and metal salts of acrylic acid such as calcium acrylate, zinc acrylate, magnesium acrylate, aluminum acrylate, and the like.

The acrylic monomers can be used alone or in admixture of two or more depending upon the intended use of the photosensitive composition. For example, a thin film for use as a photoresist is prepared by applying a thin coating of a photosensitive resin composition to a metal surface by means of a rotary coater and then drying the same. Accordingly, the acrylic monomer used should not vaporize in the drying step and, in this case, preferable are, for example, polyethylene glycol dimethylacrylate having 9 to 23 ethylene oxide units, trimethylolethane trimethacrylate, trimethylolpropane trimethacrylate, tetramethylolmethane tetraacrylate, zinc acrylate, calcium acrylate, aluminum acrylate and the like.

Although each of the above-listed acrylic monomers can be used in a photosensitive resin for flexographic printing plate and letterpress printing plate, it is desirable for the flexographic printing plate to select those which do not impair the rubbery properties of 1,2-polybutadiene, such as, for example, n-butyl methacrylate, pentyl methacrylate, 2-ethylhexyl methacrylate, octyl methacrylate, lauryl methacrylate, stearyl methacrylate, o-carboxybenzoyloxyethyl methacrylate, o-carboxybenzoyl-2-oxypropyl methacrylate, (di-2-oxyethyl)phthalate monomethacrylate, (di-2-oxypropyl)phthalate monomethacrylate, methoxypolyethylene glycol methacrylate, polethylene glycol dimethacrylate having 9 to 23 ethylene oxide units, and corresponding acrylates.

The acrylic monomers used in accordance with the intended object are not limited to those mentioned above. For instance, in order to increase the efficiency of water-development of the flexographic printing plate, the above-mentioned monomers can be admixed with a further monomer having a high solubility in water, such as acrylamide, methacrylamide, 2-hydroxyethyl acrylate, 2-hydroxyethyl methacrylate, or the like. In order to increase the wear resistance, it is possible to add a monomer of high crosslinking ability, such as ethylene glycol dimethacrylate, diethylene glycol dimethacrylate, trimethylolpropane trimethacrylate, N,N'-methylenebisacrylamide, or the like.

The amount of the acrylic monomer to be used per 100 parts by weight of the maleic anhydride adduct of 1,2-polybutadiene is preferably 5 to 200, more preferably 10 to 100, parts by weight. If the amount is less than 5 parts by weight, the sensitivity of the photosensitive composition becomes low and a long period of exposure will be necessary, while if the amount exceeds 200 parts by weight, the flexiblility and elasticity characterisitcs of 1,2-polybutadiene are impaired and desirable physical properties for a printing plate will be difficult to obtain.

The photosensitizers (photopolymerization initiators) for use in this invention include carbonyl compounds such as benzophenone, anthraquinone, 1,2-napthoquinone, 1,4-naphthoquinone, $\beta$-methylanthraquinone, 1,2-benzanthraquinone, benzanthrone, violanthrone, 9-anthraldehyde, benzil, p,p'-tetramethyldiaminobenzophenone, and chloranil; nitro compounds such as nitrobenzene, p-dinitrobenzene, $\alpha$-nitronaphthalene, p-nitrodiphenyl, 2-nitrofluorene, 5-nitroacenaphthene, nitroaniline, 2-chloronitroaniline, 2,6-dichloro-4-nitroaniline, 5-nitro-2-aminotoluene, and the like; aromatic hydrocarbons such as anthracene, chrysene and the like; haloketones such as $\omega$-bromoacetophenone and the like; and acyloin ethers such as benzoin methyl ether, benzoin ethyl ether, benzoin isopropyl ether, benzoin n-butyl ether, benzoin octyl ether, and the like. These photosensitizers can be used alone or in admixture of two or more. The amount to be used of a photosensitizer is in the range from 0.1 to 20, preferably from 1 to 10, parts by weight per 100 parts by weight of the maleic anhydride adduct of 1,2-polybutadiene. If the amount is less than 0.1 part by weight, the sensitivity is so low that a sufficiently cured product is difficult to obtain, while if it exceeds 20 parts by weight, the photosensitizer tends to bleed.

The type of photosensitive crosslinking agent is subject to no particular restriction. Suitable compounds include azido-type photosensitive compounds such as, for example, 4,4'-diazidostilbene, p-penylenebisazide, 4,4'-diazidobenzophenone, 4,4'-diazidophenylmethane, 4,4'-diazidochalcone, 2,6-di(4'-azidobenzal)-cyclohexanone, 4,4'-diazidostilbene-$\alpha$-carboxylic acid, 4,4'-diazidodiphenyl, 4,4'-diazido-3,3'-dimethyldiphenyl, 2,7-diazidofluorene, sodium 4,4'-diazidostilben-2,2'-disulfonate, and the like. These photosensitive crosslinking agent can be used alone or in admixture of two or more.

The composition of this invention can be admixed with a polymerization inhibitor to prevent dark reaction and thermal polymerization. The inhibitors suitable for use are quinones such as benzoquinone, p-toluquinone, xyloquinone and the like; aromatic hydroxy compounds such as hydroquinone, catechol, pyrogallol and the lik, and amines such as phenyl-$\alpha$-naphthylamine, diphenyl-p-phenylenediamine, and the like.

The photosensitive composition of this invention can be shaped to a suitable thickness in accordance with the intended use and object by conventional shaping techniques such as solution casting, compression molding, and extrusion molding. In this case, it can also be shaped on a support such as aluminum, polyester, nylon, 1,2-polybutadiene, or the like.

The photosensitive composition according to this invention can be developed with water or an alcohol such as methanol, ethanol, propanol or the like alone or with a mixture of water and the above alochol; a water-miscible ether such as tetrahydrofuran, dioxane or the like; ammonium hydroxide; a caustic alkali, such as NaOH, KOH, LiOH, or the like; or the like. It is useful as a material for printing plates such as flexographic printing plate and letterpress printing plate. Furthermore, the present photosensitive composition is also suitable for use in manufacturing integrated circuits, printed circuits, and name-plates, because the resist image obtained by use of the present composition has an excellent adhesion to the support, has a sufficient resolving power, and is resistant to acids or alkalis.

The invention is illustrated below in detail with reference to Examples.

EXAMPLE 1

A maleic anhydride adduct was prepared by the addition of 20 g of maleic anhydride to 100 g of 1,2-polybutadiene ($\overline{M}v = 30,000$; vinyl content, 94%; crystallinity, 25%) and 100% equivalent of the maleic anhydride in the adduct was converted to lithium salt (this means a salt of the adduct with lithium equimolar to the anhydride herein). In a solvent mixture of 49 g of water and 4.9 g of tetrahydrofuran was dissolved 2 g of the resulting lithium salt, followed by adding 0.1 g of p,p'-tetramethyldiaminobenzophenone as photosensitizer. The resulting photosensitive composition was applied to an aluminum sheet to form a thin layer which gave, on drying, a photosensitive film. A photographic step tablet having 21 steps (Eastman Kodak's Photographic Step Tablet No. 2) was placed in close contact with said photosensitive film, exposed to a 250-W superhigh pressure mercury lamp for 30 seconds, and developed with water to remove the unexposed area. The number of resist forming steps was 12.

EXAMPLE 2

An adduct was prepared by the addition of 20 g of maleic anhydride to 100 g of 1,2-polybutadiene ($\overline{M}v = 110,000$; vinyl content, 94%; crystallinity, 20%) and 50% equivalent of the maleic anhydride in the adduct was converted to lithium salt. In a solvent mixture of 49 g of water and 49 g of tetrahydrofuran, was dissolved 2 g of the resulting lithium salt followed by adding 0.1 g of p,p'-tetramethyldiaminobenzophenone as photosensitizer. The resulting photosensitive composition was applied to an aluminum sheet to form a thin layer which gave, on drying, a photosensitive film. The same step tablet as in Example 1 was placed in close contact with said photosensitive film, exposed to a 250-W superhigh pressure mercury lamp for 30 seconds, and developed with methanol to remove the unexposed area. The number of resist forming steps was 12.

EXAMPLE 3

In a solvent mixture comprising 22.5 g of water and 67.5 g of tetrahydrofuran was dissolved 10 g of the same lithium salt of 1,2-polybutadiene-maleic anhydride adduct as used in Example 2, followed by adding 0.5 g of benzoin isopropyl ether (photosensitizer) and 0.2 g of phenyl-α-naphtylamine. The resulting photosensitive composition was spread over a sand-grained aluminum plate, and dried at 60° C for 3 hours to prepare a photosensitive resin plate carrying a photosensitive resin layer, 0.5 mm in thickness. A negative line pattern was placed in close contact with said photosensitive resin plate in a vacuum printing frame, exposed to a 250-W superhigh pressure mercury lamp for 15 minutes, and sprayed with or immersed in a solvent mixture comprising 100 parts by weight of water and 100 parts by weight of tetrahydrofuran to dissolve the unexposed area, leaving a relief image behind. The resulting relief image could be satisfactorily used in letterpress printing.

EXAMPLE 4

An adduct was prepared by the addition of 15 g of maleic anhydride to 100 g of the same 1,2-polybutadiene as used in Example 2 and 50% equivalent of the maleic anhydride in the adduct was converted to lithium salt. The resulting lithium salt was treated in the same manner as in Example 3, except that 10 g of the polymer was used. An image as good as that in Example 3 was obtained.

EXAMPLE 5

An adduct was prepared by the addition of 20 g of maleic anhydride to 100 g of the same 1,2-polybutadiene as used in Example 1, and 50% equivalent of the maleic anhydride in the adduct was converted to lithium salt. The resulting lithium salt was treated in the same manner as in Example 3, except that 10 g of the polymer and a developer solution comprising 90 parts by weight of water and 10 parts by weight of tetrahydrofuran were used. An image as good as obtained in Example 3 was obtained.

EXAMPLE 6

The procedure of Example 3 was repeated, except that a photosensitive crosslinking agent sodium 4,4'-diazidostilbene-2,2'-sulfonate was substituted for the photosensitizer benzoin isopropyl ether. An image as good as obtained in Example 3 was obtained.

EXAMPLE 7

A 1,2-polybutadiene-maleic anhydride adduct containing 28 g of the bonded maleic anhydride was treated in the same manner as in Example 2 to obtain the lithium salt. The resulting lithium salt was admixed with a photosensitizer p,p'-tetramethyldiaminobenzophenone or benzoin isopropyl ether and tested for sensitivity. A tetrahydrofuran-water (1 : 1 by weight) mixture was used as developer solution.

| Photosensitizer | Number of resist-forming steps |
|---|---|
| p,p'-Tetramethyldiamino-benzophenone | 14 |
| Benzoin isopropyl ether | 12 |

EXAMPLE 8

A maleic anhydride adduct (bonded maleic anhydride content, 17% by weight) of a 1,2-polybutadiene having a viscosity-average molecular weight of 92,000, a vinyl content of 94%, and a crystallinity of 25% was converted to lithium salt [100% equivalent of maleic anhydride in the adduct was converted to lithium salt]. The lithium salt was dissolved in a tetrahydrofuran-water (3 : 1 by volume) mixture to yield a solution containing 10% by weight of the lithium salt. A photosensitive resin composition was prepared by thoroughly mixing 20 g of the said lithium salt solution, 1.6 g of nonaethylene glycol dimethacrylate, and 0.01 g of benzoin isopropyl ether at the reflux temperature of tetrahydrofuran. The resulting composition was poured on a rubber sheet, 28 cm² in area and 0.3 mm in thickness, allowed to stand for 24 hours, and then dried at 60° C for 2 hours to form a photosensitive solid layer, 0.8 mm in thickness.

The photosensitive layer obtained above was exposed for 2 minutes to ultraviolet rays emitted from a 3-KW high pressure mercury lamp at a position 80 cm above the photosensitive layer through a negative film, to photocure the exposed area. The unexposed area was removed by dissolving it in a tetrahydrofuran-water (1 : 1 by volume) mixture, leaving behind a relief image of 0.8 mm in thickness, with good fidelity to the negative film image. This relief image had a satisfactory rubber elasticity and flexibility and a rubber hardness of 70 (Shore A).

EXAMPLE 9

A lithium salt (100% equivalent) of a maleic anhydride adduct (bonded maleic anhydride content, 18% by weight) of the same 1,2-polybutadiene as used in Example 8 was dissolved in a tetrahydrofuran-water (3 : 1 by volume) mixture to form a 10% by weight solution. In the same manner as in Example 8, 60 g of the above solution, 3.0 g of tetradecaethylene glycol dimethacrylate, 3.0 g of 2-hydroxyethyl methacrylate, 0.06 g of benzoin isopropyl ether, and 0.012 g of a polymerization inhibitor p-toluquinone were uniformly mixed to form a photosensitive resin composition. The resulting composition was poured on a rubber sheet, 100 cm² in area and 0.3 mm in thickness, allowed to stand for 24 hours, and dried at 70° C for one hour to obtain a photosensitive solid layer, 0.8 mm in thickness.

A printing plate was made in the same manner as in Example 8 to obtain a relief image of 0.8 mm in thickness, with good fidelity to the negative film image and having a sufficient rubber elasticity and flexibility and a rubber hardness of 75 (Shore A).

EXAMPLE 10

A maleic anhydride adduct (bonded maleic anhydride content, 22% by weight) of a 1,2-polybutadiene having a viscosity-average molecular weight of 20,000, a vinyl content of 86%, and a crystallinity of 30% was converted to lithium salt (100% equivalent). A photosensitive resin composition was prepared in the same way as in Example 8 by homogeneously mixing 180 g of a 10-% (by weight) solution of the said lithium salt in a tetrhydrofuran-water (3 : 1 by volume) mixture, 18 g of tetradecaethylene glycol dimethacrylate, and 0.09 g of benzoin isopropyl ether. The composition was dried and the resulting photosensitive sheet was superposed on a polyester sheet 0.1 mm in thickness and compression-molded by means of a molding press [spacer, 0.8 mm; 100° C, 30 kg/cm² (pressure gauge value), 20 seconds] to obtain a photosensitive solid layer, 0.8 mm in thickness.

The photosensitive layer obtained above was exposed for 5 minutes to a 3-KW high pressure mercury lamp at a position 40 cm above the photosensitive layer through a negative film. On development with water (spraying pressure: 4 kg/cm²) alone, there was obtained a relief image, 0.8 mm in thickness, with good fidelity to the negative film. Since this relief image showed scarcely any change after immersion in isopropanol or toluene for 24 hours, it is resistant to the solvent of printing ink. It had flexibility, rubber elasticity, and a rubber hardness of 79 (Shore A).

EXAMPLE 11

A maleic anhydride adduct (bonded maleic anhydride content, 24% by weight) of a 1,2-polybutadiene having a viscosity-average molecular weight of 33,000, a vinyl content of 86%, and a crystallinity of 15% was converted to lithium salt (100% equivalent). A photosensitive resin composition was prepared in the same way as in Example 8 by uniformly mixing 50 g of a 10-% (by weight) solution of the said lithium salt in a tetrahydrofuran-water (1 : 1 by volume) mixture, 2 g of lauryl methacrylate, and 0.025 g of benzoin isopropyl ether. The resulting composition was poured on a 1,2-polybutadiene (JSR RB820 of Japan Synthetic Rubber Co.) sheet, 100 cm² in area, allowed to stand for 24 hours, and dried at 70° C for 2 hours to form a photosensitive solid layer, 0.7 mm in thickness.

A printing plate was made by repeating the procedure of Example 10 to obtain a relief image, 0.7 mm in thickness, with good fidelity to the negative film. This relief image also had a desirable rubber elasticity as well as flexibility and a rubber hardness of 67 (Shore A).

EXAMPLE 12

A photosensitive resin composition was prepared by uniformly mixing 50 g of a 10-% (by weight) solution of the same lithium salt (100% equivalent) as in Example 11 in a tetrahydrofuran-water (3 : 1 by volume) mixture, 4 g of -carboxybenzoyloxyethyl acrylate, and 0.08 g of benzoin isopropyl ether at the reflux temperature of tetrahydrofuran. The resulting composition was poured on a polyester sheet (0.3 mm in thickness and with a sand-grained surface), allowed to stand for 24 hours, and dried at 70° C for 2 hours to form a solid photosensitive layer, 0.7 mm in thickness. The said photosensitive layer was exposed for 2 minutes to a 3-KW high pressure mercury lamp at a position 40 cm above photosensitive layer through a negative film, and developed with water (spraying pressure: 4kg/cm²) alone to obtain a relief image, 0.7 mm in depth. This relief image had a stisfactory rubber elasticity as well as flexibility and a rubber hardness of 60 (Shore A).

EXAMPLE 13

A maleic anhydride adduct was prepared from 100 g of 1,2-polybutadiene (viscosity-average molecular weight, 23,000; vinyl content, 85%; crystallinity, 25%) and 20.3 g of maleic anhydride. A homogeneous photosensitive composition was prepared by mixing 10 g of the adduct (the acid anhydride rings of which had been opened with hot water), dissolved in 90 g of a tetrahydrofuran-water (1 : 1 by volume) mixture, 0.5 g of benzoin isopropyl ether, 4 g of tetradecaethylene glycol dimethacrylate, and 0.2 g of hydroquinone.

By using the said composition, a photosensitive resin plate, 0.6 mm in thickness, was prepared in a manner similar to that in Example 10. The resulting plate was exposed for one minute to a 250-W superhigh pressure mercury lamp and developed with 0.5-% aqueous solution of sodium hydroxide. After 3 minutes of development, there was obtained a printing plate with high fidelty to the original.

The same procedure as above was repeated except that 1,2-polybutadiene (viscosity average molecular weight, 8,000; vinyl content, 85 %; crystallinity, 25%) was substituted for the 1,2-polybutadiene. The printing plate thus obtained was poor in rubber elasticity and was cracked by bending.

EXAMPLE 14

A photosensitive resin plate, 0.6 mm in thickness, was prepared in the same manner as in Example 13, except that the polymer used was a potassium salt prepared by neutralizing with potassium hydroxide a maleic anhydride adduct obtained by adding 24.3 g of maleic anhydride to 100 g of a 1,2-polybutadiene (molar ratio of potassium hydroxide to maleic anhydride in the adduct was 2 : 1). The above photosensitive plate was exposed for one minute to a 250-W superhigh pressure mercury lamp and developed with a 3-% aqueous solution of sodium carbonate. Ater 3 minutes of the development, there was obtained a printing plate with good fidelity to the original.

EXAMPLE 15

A maleic anhydride adduct was prepared by adding 25.0 g of maleic anhydride to 100 g of a 1,2-polybutadiene having a viscosity-average molecular weight of 34,000, a crystallinity of 25%, and a vinyl content of 80%. A homogeneous photosensitive composition was prepared by mixing 10 g of the said adduct dissolved in 90 g of tetrahydrofuran, 0.5 g of benzoin isopropyl ether, 5 g of trimethylolpropane trimethacrylate, and 0.2 g of phenyl-$\alpha$-naphthylamine as thermal polymerization inhibitor.

A photosensitive resin plate, 0.7 mm in thickness, was obtained in the same manner as in Example 10. The said plate was exposed for one minute to a 250-W superhigh pressure mercury lamp and developed with a mixture of a 0.5-% aqueous solution of sodium hydroxide and tetrahydrofuran (7 : 3 by volume). After 3 minutes of the development, a printing plate with high fidelity to the original was obtained.

What is claimed is:
1. A photosensitive composition, comprising: a mixture of a maleic anhydride adduct of a 1,2-polybutadiene having a viscosity-average molecular weight of at least 10,000 and having a vinyl content of at least 70% and at least one member selected from the group consisting of photosensitizers and photosensitive cross-linking agents, wherein said photosensitizer is selected from the group consisting of carbonyl compounds, nitro compounds, aromatic hydrocarbon compounds, haloketones and acyloin ethers, and wherein said photosensitive cross-linking agent is an azido type cross-linking agent, whereby, when said photosensitive composition on a supporting substrate is ex- posed to light, that portion of said composition exposed to light hardens, while that portion of said composition which is masked from light, remains unhardened and is readily removed from the hardened composition by treatment with water, an alcohol or a mixture of water, an alcohol and an ether, thereby leaving the hardened image on its supporting substrate.

2. A photosensitive composition according to claim 1, wherein the 1,2-polybutadiene has a visocisty-average molecular weight of 10,000 to 150,000.

3. A photosensitive composition according to claim 1, wherein the 1,2-polybutadiene has a crystallinity of 5% to 45%.

4. A photosensitive composition according to claim 1, wherein the bonded maleic anhydride content of the maleic anhydride adduct is 10 to 30% by weight.

5. A photosensitive composition according to claim 1, wherein the maleic anhydride adduct is partially or completely neutralized with an alkali metal.

6. A photosensitive composition according to claim 5, wherein the alkali is lithium.

7. A photosensitive composition according to claim 1, wherein the photosensitizer is selected from acyloin ethers.

8. A photosensitive composition according to claim 7, wherein the acyloin ether is seleceted from the group consisting of benzoin methyl ether, benzoin ethyl ether, benzoin isopropyl ether, benzoin n-butyl ether and benzoin octyl ether.

9. A photosensitive composition according to claim 1, wherein the amount of the photosensitizer is 0.1 to 20 parts by weight per 100 parts by weight of the adduct.

10. A photosensitive composition according to claim 1, wherein the photosensitive crosslinking agent is selected from the group consisting of 4,4'-diazidostilbene, p-phenylenebisazide, 4,4'-diazidobenzophenone, 4,4'-diazidodiphenylmethane, 4,4'-diazidochalcone, 2,6-di(4'-azidobenzal) cyclohexanone, 4,4'-diazidostilbene-α-carboxylic acid, 4,4'-diazidodiphenyl, 4,4'-diazido-3,3'-dimethyldiphenyl, 2,7-diazidofluorene, and sodium 4,4'-diazidobenzalacetone-2-sulfonate.

11. A printing plate composed of a layer of the photosensitive composition according to claim 1 coated on a supporting substrate.

12. The printing plate according to claim 1, wherein the substrate is a flexible support.

13. A photosensitive composition, comprising: a mixture of a maleic anhydride adduct of a 1,2-polybutadiene having a viscosity-average molecular weight of at least 10,000 and having a vinyl content of at least 70% and at least one member selected from the group consisting of photosensitizers and photosensitive cross-linking agents, wherein said photosensitizer is selected from the group consisting of carbonyl compounds, nitro compounds, aromatic hydrocarbon compounds, haloketones and acyloin ethers, and wherein said photosensitive cross-linking agent is an azido type cross-linking agent, and at least one acrylic monomer selected from the group consisting of esters, amides, and metal salts of acrylic and methyacrylic acids, whereby, when said photosensitive composition on a supporting substrate is exposed to light, that portion of said composition exposed to light hardens, while that portion of said composition which is masked from the light, remains unhardened and is readily removed from the hardened composition by treatment with water, an alcohol or a mixture of water, and alcohol and an ether, thereby leaving the hardened image on its supporting substrate.

14. A photosensitive composition according to claim 13, wherein the 1,2-polybutadiene has a viscosity-average molecular weight of 10,000 to 150,000.

15. A photosensitive composition according to claim 13, wherein the ester is selected from the group consisting of alkyl esters, hydroxyalkyl esters, alkylene glycol diesters, polyalkylene glycol diesters, alkoxyalkylene glycol monoesters, alkoxypolyalkylene glycol monesters, and di-, tri-, and tetraesters of polyhydric alcohols.

16. A photosensitive composition according to claim 15, wherein the acrylic monomer is selected from the group consisting of n-butyl methacrylate, pentyl methacrylate, 2-ethylhexyl methacrylate, octyl methacrylate, lauryl methacrylate, stearyl methacrylate, o-carboxybenzoyloxyethyl methacrylate, o-carboxybenzoyl-2-oxypropyl methacrylate, (di-2-oxyethyl)phthalate monomethacrylate, (di-2-oxypropyl)phthalate monomethacrylate, methoxypolyethylene glycol methacrylates, polyethylene glycol dimethacrylates having 9 to 23 ethylene oxide units, and acrylates corresponding to these methacrylates.

17. A photosensitive composition according to claim 15, wherein the acrylic monomer is selected from the group consisting of o-carboxybenzoyloxyethyl methacrylate, o-carboxybenzoyl-2-oxypropyl methacrylate, (di-2-oxyethyl)phthalate monomethacrylate, and acrylates corresponding to these methacrylates.

18. A photosensitive composition according to claim 13, wherein the metal salt of acrylic acid is selected from the group consisting of calcium acrylate, zinc acrylate, magnesium acrylate, and aluminum acrylate.

19. A photosensitive composition according to claim 13, wherein the amount of the acrylic monomer is 5 to 200 parts by weight per 100 parts by weight of the maleic anhydride adduct.

20. A photosensitive composition according to claim 13, wherein the amount of the acrylic monomer is 10 to 100 parts by weight per 100 parts by weight of the maleic anhydride adduct.

21. A printing plate composed of a layer of the photosensitive material according to claim 13 coated on a supporting substrate.

22. The printing plate according to claim 21, wherein the substrate is a flexible support.

* * * * *

UNITED STATES PATENT AND TRADEMARK OFFICE
CERTIFICATE OF CORRECTION

PATENT NO. : 4,023,973
DATED : May 17, 1977
INVENTOR(S) : Fumitake Imaizumi, et al It is certified that error appears in the above-identified patent and that said Letters Patent are hereby corrected as shown below:

On the Title Page, Item [30]:
Delete "April 8, 1974" and insert therefore --April 18, 1974--

Signed and Sealed this second Day of August 1977

[SEAL]

Attest:

RUTH C. MASON
*Attesting Officer*

C. MARSHALL DANN
*Commissioner of Patents and Trademarks*